United States Patent
Ravi et al.

(10) Patent No.: US 8,124,509 B2
(45) Date of Patent: Feb. 28, 2012

(54) METHOD OF FORMING POROUS DIAMOND FILMS FOR SEMICONDUCTOR APPLICATIONS

(75) Inventors: Kramadhati V. Ravi, Atherton, CA (US); Yuli Chakk, Ashdod (IL)

(73) Assignee: Intel Corporation, Santa Clara, CA (US)

( * ) Notice: Subject to any disclaimer, the term of this patent is extended or adjusted under 35 U.S.C. 154(b) by 1980 days.

(21) Appl. No.: 10/857,057

(22) Filed: May 28, 2004

(65) Prior Publication Data

US 2005/0277303 A1  Dec. 15, 2005

(51) Int. Cl.
*H01L 21/265* (2006.01)

(52) U.S. Cl. ........ 438/520; 438/528; 438/766; 438/780; 438/931

(58) Field of Classification Search .......................... None
See application file for complete search history.

(56) References Cited

U.S. PATENT DOCUMENTS

| | | | | |
|---|---|---|---|---|
| 4,957,591 | A | * | 9/1990 | Sato et al. ........................ 216/67 |
| 5,236,545 | A | * | 8/1993 | Pryor ............................... 117/95 |
| 5,500,077 | A | * | 3/1996 | Nishibayashi et al. .......... 216/38 |
| 5,645,900 | A | * | 7/1997 | Ong et al. ....................... 427/571 |
| 5,731,046 | A | * | 3/1998 | Mistry et al. ................... 427/553 |
| 6,727,171 | B2 | * | 4/2004 | Takeuchi et al. ............... 438/624 |

* cited by examiner

*Primary Examiner* — Zandra Smith
*Assistant Examiner* — Khanh Duong
(74) *Attorney, Agent, or Firm* — Trop, Pruner & Hu, P.C.

(57) ABSTRACT

The porosity of a diamond film may be increased and its dielectric constant lowered by exposing a film containing $sp^3$ hybridization to ion implantation. The implantation produces a greater concentration of $sp^2$ hybridizations. The $sp^2$ hybridizations may then be selectively etched, for example, using atomic hydrogen plasma to increase the porosity of the film. A series of layers may be deposited and successively treated in the same fashion to build up a composite, porous diamond film.

10 Claims, 3 Drawing Sheets

METHOD OF FORMING POROUS DIAMOND FILMS FOR SEMICONDUCTOR APPLICATIONS

BACKGROUND

This invention relates generally to the fabrication of integrated circuits.

As the dimensions of integrated circuits have become smaller and the speed of logic and microprocessor products have increased, a limit is faced after which proceeding in the same fashion will no longer produce the corresponding speed and performance improvements. The RC time constant associated with the interconnects in integrated circuits and the related dielectrics will ultimately slow down the speed improvements achieved by reducing device dimensions.

Thus, interlayer dielectric materials are being developed with decreasing dielectric constants below that of traditional silicon dioxide dielectric. Currently, many such dielectrics are materials that have low mechanical strength as a result of using doped oxides. An example is carbon doped oxide. Dielectric constant materials made from organic materials, such as spin-on dielectric, may also exhibit lower mechanical strength.

The lower mechanical strength of these decreased dielectric constant materials leads to mechanical and structural problems during wafer processing, assembly, and packaging operations. Consequently, there is a need for low dielectric constant materials with good mechanical strength that can withstand wafer processing and assembly operations and so that the resulting products are reliable in operation.

Pure diamond films may be synthesized by various chemical vapor deposition techniques to have very high strength and a low dielectric constant. Diamond films with lower dielectric constants and higher moduluses would be desirable. One approach for reducing the dielectric constants of these films, while still maintaining adequate mechanical properties, is to introduce porosity into the films.

Thus, there is a need for ways to introduce porosity into diamond films used for semiconductor applications.

DETAILED DESCRIPTION

Diamond and diamond-like carbon films are generally synthesized using plasma activated chemical vapor deposition processes using mixtures of hydrocarbon, such as methane, and hydrogen. Depending on the deposition conditions, these films may reveal a range of mechanical, electronic, and electrochemical properties that depend on the ratio of $sp^3$ (diamond-like) to $sp^2$ (graphite-like) bonds. For synthesizing higher purity diamond films without non-diamond forms of carbon (e.g., graphite, amorphous carbon, etc.), a low methane concentration and a supersaturation of hydrogen may be used. As the methane concentration is increased, the percentage of non-diamond forms of carbon increases.

When such mixed phase materials are subjected to an etching process in an atomic hydrogen environment, the non-diamond forms of carbon are preferentially etched. At the same time, the hydrogen does not substantially attack the diamond form of carbon. The etching of the non-diamond form of carbon results in the generation of porosity in the film with the attendant reduction in the dielectric constant of the film. Since much of the remaining carbon is in the form of diamond bonded material ($sp^3$ hybridization), the mechanical strength of these films can be high in some cases.

An increase in the percentage of non-diamond forms of carbon can be achieved by implanting noble gas ions into synthesized diamond films. Ion implantation induces damage in diamond by breaking some of the $sp^3$ bonds. When the density of broken bonds reaches sufficient concentration, the damaged material reconstructs to form $sp^2$ bonds, which are susceptible to etching by atomic hydrogen.

Figure 1A:
FIG. 1A is an enlarged, schematic depiction of one embodiment of the present invention at an early stage.

Referring to FIG. 1A, a substrate 10 supports a carbon containing film 12. The film 12 may be a mixed phase carbon film including $sp^2$ and $sp^3$ hybridizations formed by plasma enhanced chemical vapor deposition (PECVD).

The $sp^2$ carbon concentration in the film 12 may be increased by increasing the methane concentration in the plasma tool used to form the film 12. In one embodiment, from 5 to 30 atomic percent methane may be used to initially deposit the film 12. While conventionally diamond film is made in a steady state process that ends up with pure diamond, here, the goal is to form a mixed phase film. The remainder of the atmosphere in the plasma tool may be primarily hydrogen gas.

The final film 12 may be built in a series of layers. Each layer may be between 500 and 1000 Angstroms thick in one embodiment. Each layer of film 12 may be formed by injecting hydrogen and a hydrocarbon into a plasma tool. A plasma is stricken to obtain an atomic hydrogen plasma by converting the hydrogen gas to atomic hydrogen.

Figure 1B:
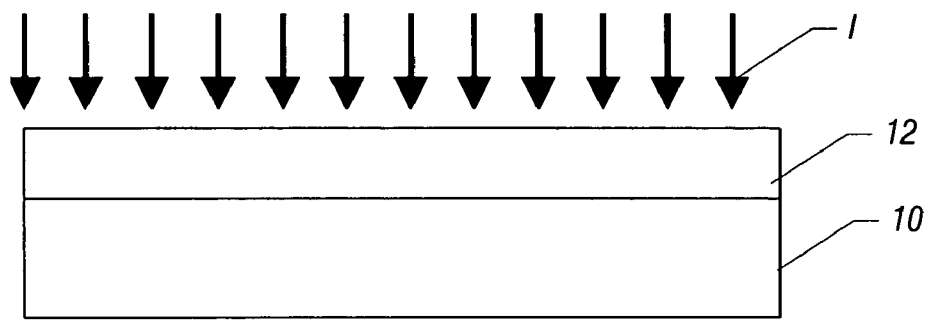
FIG. 1B is a cross-sectional view corresponding to FIG. 1A at a subsequent stage in accordance with one embodiment of the present invention.

The film 12 may be exposed to atomic hydrogen plasma, indicated as P in FIG. 1A, to selectively etch the non-diamond carbon hybridization. Then, the selectively etched film 12 is exposed to noble gas ion implantation, indicated as I in FIG. 1B. The depth of ion implantation damage is a function of the ion dose and energy. In one embodiment, xenon or argon may be implanted into the film 12. A typical ion dose is in the range of the $10^{14}$ to $10^{15}$ cm$^{-2}$ with ion energies of 100 to 300 keV. Variations in implant dose and energy may be used to control damage and/or the degree of disorder in the films 12.

Figure 1C:
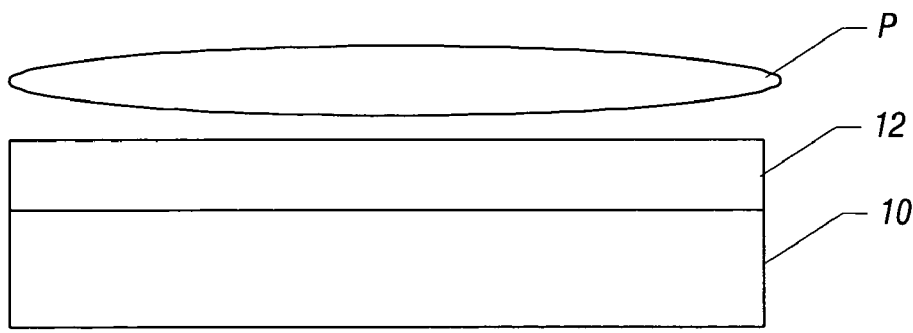
FIG. 1C is a cross-sectional view corresponding to FIG. 1B at a subsequent stage in accordance with one embodiment of the present invention.

Thereafter, the film 12 may be exposed to atomic hydrogen plasma, indicated as P in FIG. 1C, to selectively etch additional non-diamond carbon.

A new film layer (not shown) may be deposited on top of the previous film 12. The process may then be repeated until the desired total film thickness is achieved. For example, three or more layers may be built up to form the final film thickness. In one embodiment, ten layers may be built up successively.

Figure 2A:
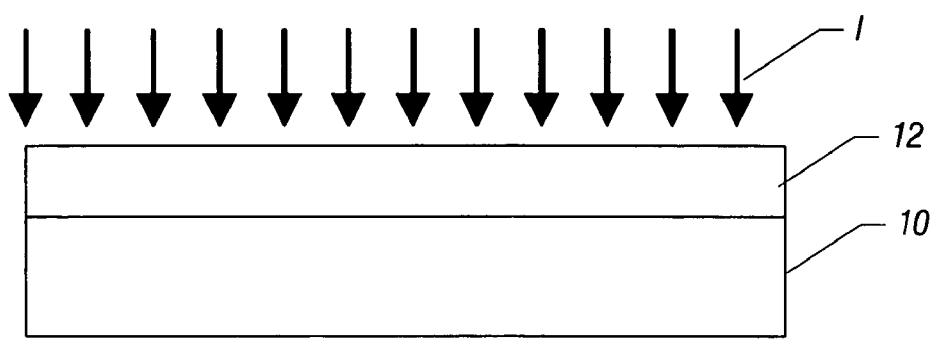
FIG. 2A is an enlarged, cross-sectional, schematic view of another embodiment of the present invention.

Referring to FIG. 2A, the mixed phase carbon film 12 may again be formed by PECVD on a substrate 10. Ion implantation, indicated by I in FIG. 2A, converts $sp^3$ hybridizations to $sp^2$ hybridization. The implantation conditions may be as described previously in one embodiment. The implantation partially damages the $sp^3$ hybridizations.

Figure 2B:
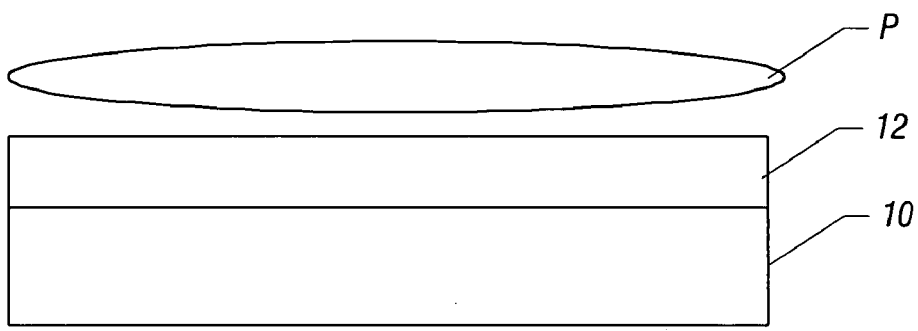
FIG. 2B is an enlarged, cross-sectional, schematic view corresponding to FIG. 2A after further processing.
Figure 2C:
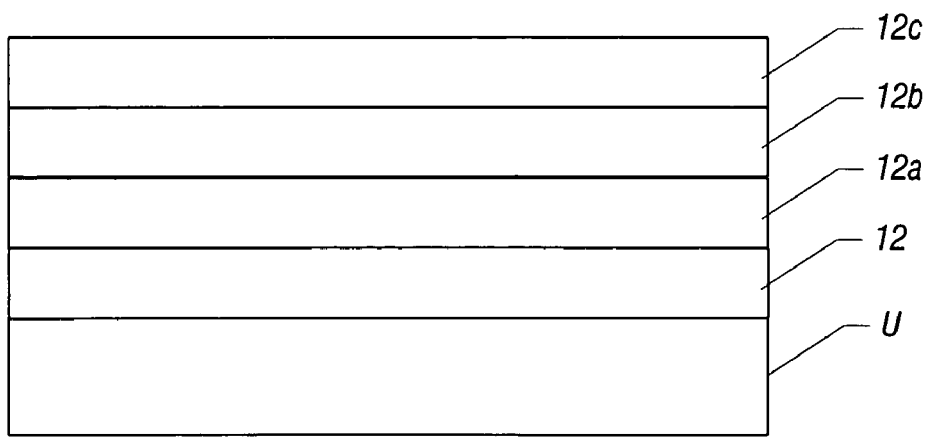
FIG. 2C is an enlarged, cross-sectional, schematic view corresponding to FIG. 2B after further processing.

Then, as shown in FIG. 2B, the film 12 may be exposed to hydrogen plasma P to selectively etch the non-diamond hybridizations. As a result, pores may be created. The process may be repeated until the desired film thickness is achieved by forming a series of film layers 12-12C, shown in FIG. 2C, that are treated (before the next layer 12 is deposited) to increase their porosity, followed by deposition of a new layer.

The implantation and subsequent atomic hydrogen etching process increases the uniformity of damage and, hence, pore creation in the film 12. In addition, the implantation/hydrogen etch may be achieved after the film 12 is patterned on a wafer in the course of creating the interconnect structure.

Figure 3:
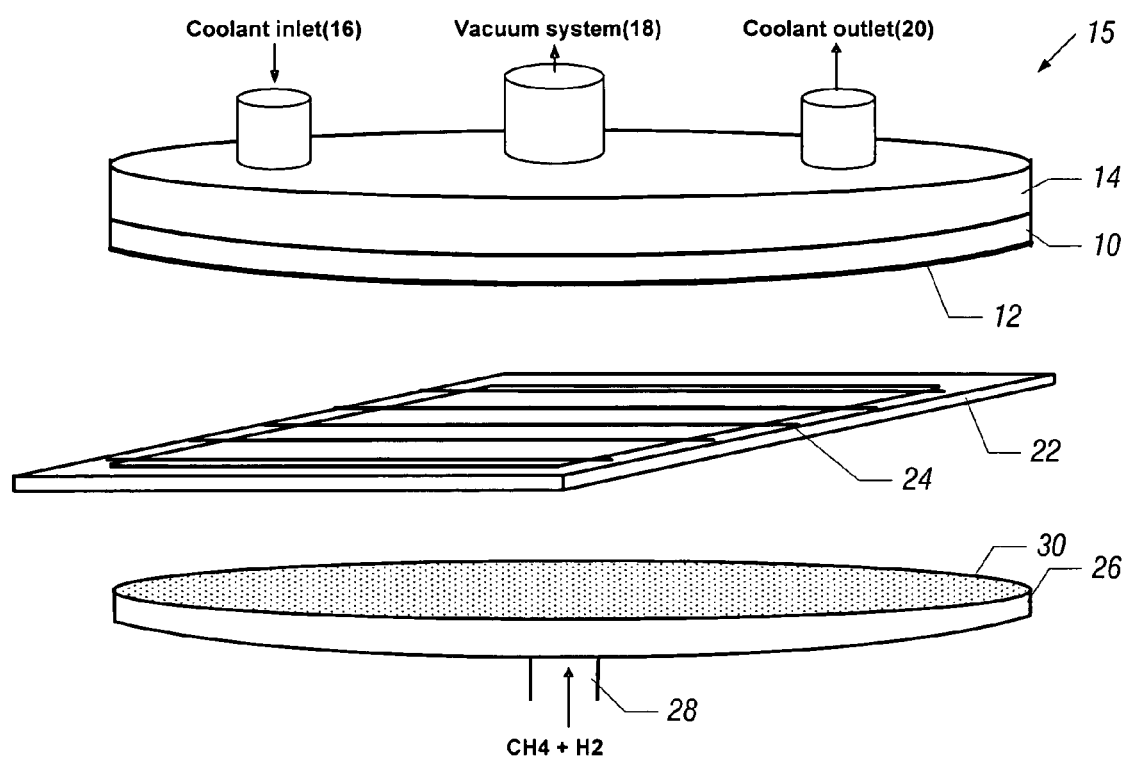
FIG. 3 is a schematic depiction of a chamber for use in one embodiment of the present invention.

Referring to FIG. 3, a plasma tool 15 may be provided within an enclosed chamber (not shown). The tool 15 may include a vacuum chuck 14 which holds the wafer or substrate 10, covered by the film 12. The chuck 14 may be cooled via coolant introduced into the chuck 14 through a coolant inlet 16 and ejected thru a coolant outlet 20. A vacuum port 18 may provide for suction to releasably hold the substrate 10 on the chuck 14.

Opposed to the film 12 is a shower head 26 having a plurality of apertures 30. A jet of reaction gases is injected into the chamber through the apertures 30 which act as nozzles. In particular, methane and hydrogen gas may be received through an input port 28 and ejected through the apertures 30 into the region of the film 12. The reaction of methane and hydrogen gas, as described previously, results in the deposition of the carbon containing film 12.

The gases that exit through the apertures 30 may be rapidly heated as they pass through a heating frame 22, including heated filaments 24. The filaments 24 may be attached to the peripheral frame 22 to provide rapid heating of the ejected gases. In one embodiment, the filaments 24 may be electrically heated tungsten or rhenium filaments. The filaments 24 may provide relatively high heat in a very short time. In one embodiment, the filaments 24 can be heated to elevated temperatures greater than 200° C. by resistance heating to provide the energy needed to crack the process gases and to generate atomic hydrogen.

As a result of the localized heating of the gas just before it reaches the wafer or substrate 10 and due to the substrate 10 cooling, the heat transferred to the semiconductor wafer or substrate 10 may be reduced. Excessive substrate temperatures may adversely affect components of the substrate 10. To counteract any heating that occurs, the coolant flow continually cools the opposite side of the wafer during the deposition process. In some cases, the substrate 10 may be maintained at a temperature below 450° C., which is sufficient to reduce any adverse impact of temperature.

The wafer temperature control may be modulated by allowing the spacing between the frame 22 and the substrate 10 to be adjusted. The sources of energy to the substrate 12 may include irradiation from the filaments 24, conduction or convection from hot gases near the filaments 24, and heat released by the recombination of atomic hydrogen at the substrate 10 surface. Radiation, conduction, and convection can be reduced by moving the substrate 10 away from the filament array 24.

The growth rate of the diamond film may be enhanced by providing the shower head 26 so that the process gases can be conveyed to the wafer 10, past the filaments 24 at relatively high velocity. This high gas velocity enhances the growth rate of the film 12.

Typically pure diamond films are grown with low concentrations of methane in a super saturation of hydrogen. Since the synthesis of porous diamond films involves mixed phase materials, a higher ratio of methane to hydrogen is used. This higher methane ratio has the added benefit of enhancing film 12 growth rates.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   implanting a carbon containing film to convert $sp^3$ hybridization to $sp^2$ hybridization; and
   etching the $sp^2$ hybridization to increase the porosity of the film.

2. The method of claim 1 including forming a carbon containing film with $sp^2$ hybridization.

3. The method of claim 2 including forming said film using more than 5 atomic percent methane and less than 95 percent hydrogen.

4. The method of claim 3 including forming atomic hydrogen plasma to form said carbon containing film.

5. The method of claim 1 including forming a second carbon containing film over said carbon containing film after etching said $sp^2$ hybridization to increase the porosity of said film.

6. The method of claim 1 including selectively etching the film to etch $sp^2$ hybridization prior to said implanting the carbon containing film.

7. The method of claim 1 wherein etching the $sp^2$ hybridization includes etching using atomic hydrogen plasma.

8. The method of claim 1 including forming more than three carbon containing layers, each of said layers being etched to increase the porosity of the layer.

9. The method of claim 8 including forming said layers having a thickness between about 500 and 1000 Angstroms.

10. The method of claim 9 including depositing the layers using a plasma having more than 5 atomic percent methane and less than 95 percent hydrogen.

* * * * *